(12) United States Patent
Ohyama et al.

(10) Patent No.: US 10,317,595 B2
(45) Date of Patent: Jun. 11, 2019

(54) ORGANIC LIGHT EMITTING DEVICE INCLUDING CIRCULAR POLARIZING PLATE HAVING RETARDATIONS CORRESPONDING TO PIXELS

(71) Applicant: SAMSUNG ELECTRONICS CO., LTD., Suwon-si (KR)

(72) Inventors: Tsuyoshi Ohyama, Suwon-si (KR); Eun Sung Lee, Hwaseong-si (KR); Nobuo Hamamoto, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 11 days.

(21) Appl. No.: 14/789,206

(22) Filed: Jul. 1, 2015

(65) Prior Publication Data

US 2016/0233273 A1 Aug. 11, 2016

(30) Foreign Application Priority Data

Feb. 11, 2015 (KR) ........................ 10-2015-0020948

(51) Int. Cl.
*H01L 27/32* (2006.01)
*H01L 51/52* (2006.01)
*G02B 5/30* (2006.01)

(52) U.S. Cl.
CPC ......... *G02B 5/3025* (2013.01); *G02B 5/3083* (2013.01); *H01L 51/5281* (2013.01); *G02B 5/3008* (2013.01); *G02B 5/3016* (2013.01); *H01L 27/3211* (2013.01);

(Continued)

(58) Field of Classification Search
CPC ............ H01L 27/3218; H01L 27/3232; H01L 51/5293; H01L 27/3211; G02B 5/3016; G02B 5/3025; G02B 5/3083
See application file for complete search history.

(56) References Cited

U.S. PATENT DOCUMENTS

| | | | | |
|---|---|---|---|---|
| 6,061,111 A | * | 5/2000 | Kataoka | G02F 1/133504 349/113 |
| 6,520,645 B2 | * | 2/2003 | Yamamoto | G03B 33/12 348/E9.027 |

(Continued)

FOREIGN PATENT DOCUMENTS

| | | |
|---|---|---|
| JP | 3325560 | 9/2002 |
| JP | 2010522892 | 7/2010 |

(Continued)

*Primary Examiner* — Yu Chen
*Assistant Examiner* — Christopher M Roland
(74) *Attorney, Agent, or Firm* — Cantor Colburn LLP

(57) ABSTRACT

An organic light emitting device includes a display panel including a plurality of pixels and a circular polarizing plate disposed opposite to the display panel, where the circular polarizing plate has a plurality of retardations corresponding to the pixels of the display panel. A method of manufacturing an organic light emitting device includes preparing a display panel including a plurality of pixels, preparing a circular polarizing plate having a plurality of retardations, and assembling the display panel and the circular polarizing plate, where the display panel and the circular polarizing plate are assembled so that the retardations of the circular polarizing plate respectively correspond to the pixels of the display panel.

15 Claims, 10 Drawing Sheets

(52) U.S. Cl.
CPC ...... *H01L 27/3218* (2013.01); *H01L 27/3232* (2013.01); *H01L 51/5293* (2013.01)

(56) References Cited

U.S. PATENT DOCUMENTS

| | | | |
|---|---|---|---|
| 6,661,484 B1 * | 12/2003 | Iwai | G02F 1/133371 |
| | | | 349/107 |
| 7,336,857 B2 | 2/2008 | Kawahara et al. | |
| 7,625,612 B2 | 12/2009 | Ohmori et al. | |
| 7,852,561 B2 | 12/2010 | Chiba et al. | |
| 8,119,026 B2 | 2/2012 | Parri et al. | |
| 8,425,991 B2 | 4/2013 | Nimura et al. | |
| 8,512,824 B2 | 8/2013 | Kasianova et al. | |
| 8,947,780 B2 | 2/2015 | Matsuyama et al. | |
| 2004/0263730 A1 * | 12/2004 | Ishizaki | G02F 1/13363 |
| | | | 349/117 |
| 2005/0142464 A1 * | 6/2005 | Moriya | G02B 5/201 |
| | | | 430/7 |
| 2006/0246232 A1 | 11/2006 | Kubo et al. | |
| 2007/0077502 A1 * | 4/2007 | Moriya | G02F 1/133514 |
| | | | 430/7 |
| 2009/0091238 A1 * | 4/2009 | Cok | H01L 27/322 |
| | | | 313/498 |
| 2009/0096966 A1 * | 4/2009 | Umemoto | G02B 5/223 |
| | | | 349/106 |
| 2009/0122237 A1 | 5/2009 | Fukagawa et al. | |
| 2010/0157204 A1 * | 6/2010 | Ichihashi | C09K 19/3491 |
| | | | 349/75 |
| 2011/0059263 A1 * | 3/2011 | Akao | G02B 5/3016 |
| | | | 427/508 |
| 2012/0108781 A1 | 5/2012 | Adlem et al. | |
| 2012/0307359 A1 | 12/2012 | Matsuyama et al. | |
| 2014/0104523 A1 | 4/2014 | Jung et al. | |
| 2014/0146273 A1 | 5/2014 | Kim et al. | |
| 2014/0160387 A1 | 6/2014 | Wu et al. | |
| 2014/0160388 A1 | 6/2014 | Wu et al. | |
| 2014/0176880 A1 | 6/2014 | Cho | |
| 2014/0225499 A1 | 8/2014 | Ren et al. | |

FOREIGN PATENT DOCUMENTS

| | | | |
|---|---|---|---|
| JP | 2012007160 | | 1/2012 |
| JP | 2012035445 | | 2/2012 |
| JP | 2012088475 A | * | 5/2012 |
| JP | 2012150477 | | 8/2012 |
| JP | 2013029827 | | 2/2013 |
| KR | 100712178 | | 4/2007 |
| KR | 1020100037347 | | 4/2010 |
| KR | 1020120055129 | | 5/2012 |
| KR | 1020130000349 | | 1/2013 |
| KR | 1020130012887 | | 2/2013 |
| KR | 20130041827 | | 4/2013 |
| KR | 101271413 | | 5/2013 |
| KR | 1020130124882 | | 11/2013 |

* cited by examiner

FIG. 2

| B | G | B | G | B |
|---|---|---|---|---|
| G | R | G | R | G |
| B | G | B | G | B |
| G | R | G | R | G |
| B | G | B | G | B |

ORGANIC LIGHT EMITTING DEVICE INCLUDING CIRCULAR POLARIZING PLATE HAVING RETARDATIONS CORRESPONDING TO PIXELS

CROSS-REFERENCE TO RELATED APPLICATIONS

This application claims priority to Korean Patent Application No. 10-2015-0020948 filed on Feb. 11, 2015, and all the benefits accruing therefrom under 35 U.S.C. § 119, the content of which in its entirety is herein incorporated by reference.

BACKGROUND

1. Field

Embodiments of the invention relate to an organic light emitting device and a method of manufacturing the organic light emitting device.

2. Description of the Related Art

Recently, as lightness and thinness of a monitor, a television, or the like have been required, an organic light emitting device has drawn attention. The organic light emitting device is a self light-emitting display device, in which no separate backlight is included, and thus may be effectively used for a thin and flexible display device.

The organic light emitting device may reflect external light by a metal electrode and a metal wire of a display panel thereof, and the display quality thereof, e.g., the visibility and the contrast ratio thereof, may be deteriorated by reflection of the exterior light. Accordingly, to reduce such reflectance, a circular polarizing plate may be attached to a surface of a display panel, and thus leakage of the reflected external light to the outside may be reduced.

SUMMARY

A conventional or currently-developed circular polarizing plate has strong wavelength dependency, such that a circularly polarized light may be distorted for light in wavelength regions except for a specific wavelength region, and thus light leakage may occur. A compensation film may be laminated to the conventional circular polarizing plate to compensate the deteriorated visibility, but it may increase the entire thickness of the organic light emitting device.

Embodiments of the invention provide an organic light emitting device with improved display characteristics by decreasing light leakage without increasing a thickness thereof.

Embodiments of the invention provide a method of manufacturing the organic light emitting device.

According to an embodiment, an organic light emitting device includes a display panel including a plurality of pixels and a circular polarizing plate disposed opposite to the display panel, where the circular polarizing plate has a plurality of retardations corresponding to the pixels of the display panel.

In an embodiment, a microcavity effect may occur in the pixels of the display panel.

In an embodiment, the display panel may include a first pixel, a second pixel and a third pixel, where the first to third pixels display different colors from each other, and the circular polarizing plate may include a compensation film having a first region corresponding to the first pixel and having a first retardation, a second region corresponding to the second pixel and having a second retardation, and a third region corresponding to the third pixel and having a third retardation, and a polarizer.

In an embodiment, the retardations of the compensation film may satisfy the following Relationship: $R_{e1} > R_{e2} \geq R_{e3}$; or $R_{e1} \geq R_{e2} > R_{e3}$, where $R_{e1}$, $R_{e2}$ and $R_{e3}$ denote the first, second and third retardations, respectively.

In an embodiment, the first retardation may be in a range of about 125 nanometers (nm) to about 155 nm, the second retardation may be in a range of about 110 nm to about 160 nm, and the third retardation may be in a range of about 110 nm to about 125 nm.

In an embodiment, the first retardation may be in a range of about 135 nm to about 145 nm, the second retardation may be in a range of about 130 nm to about 140 nm, and the third retardation may be in a range of about 115 nm to about 125 nm.

In an embodiment, the first pixel may be a blue pixel, the second pixel may be a green pixel, and the third pixel may be a red pixel.

In an embodiment, the compensation film may include a cured liquid crystal.

In an embodiment, a reflectance of each of the first pixel, the second pixel, and the third pixel may be less than or equal to about 5%.

In an embodiment, a reflection color shift ($\Delta a^* b^*$) of each of the first pixel, the second pixel, and the third pixel may be less than or equal to about 5.

In an embodiment, a reflection color shift ($\Delta a^* b^*$) of the organic light emitting device may be less than or equal to about 5.

In an embodiment, the organic light emitting device may further include an encapsulation substrate disposed opposite to the display panel, where the compensation film may be attached to a first surface of the encapsulation substrate, and the polarizer may be attached to a second surface of the encapsulation substrate, which is opposite to the first surface.

According to another embodiment, a method of manufacturing an organic light emitting device includes preparing a display panel including a plurality of pixels, preparing a circular polarizing plate having a plurality of retardations, and assembling the display panel and the circular polarizing plate, where the display panel and the circular polarizing plate are assembled so that the retardations of the circular polarizing plate correspond to the pixels of the display panel.

In an embodiment, the display panel may include a first pixel, a second pixel, and a third pixel, where the first to third pixels display different colors from each other, the preparing the circular polarizing plate may include: preparing a compensation film including a first region having a first retardation, a second region having a second retardation, and a third region having a third retardation; and preparing a polarizer, where the first region, the second region and the third region of the compensation film may correspond to the first pixel, the second pixel and the third pixel of the display panel, respectively.

In an embodiment, the preparing the compensation film may include providing a liquid crystal layer for a compensation film on a first surface of a substrate, and curing the liquid crystal layer while changing a temperature to provide the first, second and third regions having different retardations from each other.

In an embodiment, the curing the liquid crystal layer for the compensation film may include disposing a mask on the liquid crystal layer and performing a first exposure at a first temperature to provide the first region, disposing a mask on the liquid crystal layer and performing a second exposure at a second temperature to provide the second region, and performing a third exposure at a third temperature to provide the third region.

In an embodiment, the second temperature may be higher than the first temperature, and the third temperature may be higher than the second temperature.

In an embodiment, the method may further include forming an alignment layer on the substrate before the providing the liquid crystal layer for the compensation film.

In an embodiment, the method may further include providing the polarizer on a second surface of the substrate, which is opposite to the first surface, where the substrate may be an encapsulation substrate.

In an embodiment, the retardations of the compensation film may satisfy the following Relationship: $R_{e1} > R_{e2} \geq R_{e3}$; or $R_{e1} \geq R_{e2} > R_{e3}$, where $R_{e1}$, $R_{e2}$ and $R_{e3}$ denote the first, second and third retardations, respectively.

In an embodiment, the first retardation may be in a range of about 125 nm to about 155 nm, the second retardation may be in a range of about 110 nm to about 160 nm, and the third retardation may be in a range of about 110 nm to about 125 nm.

In an embodiment, the first retardation may be in a range of about 135 nm to about 145 nm, the second retardation may be in a range of about 130 nm to about 140 nm, and the third retardation may be in a range of about 115 nm to about 125 nm.

In an embodiment, the first pixel may be a blue pixel, the second pixel may be a green pixel, and the third pixel may be a red pixel.

BRIEF DESCRIPTION OF THE DRAWINGS

These and/or other features of the invention will become apparent and more readily appreciated from the following detailed description of embodiments thereof, taken in conjunction with the accompanying drawings, in which:

FIG. 2 is a top plan view showing an arrangement of a plurality of pixels of the display panel in an embodiment of the organic light emitting device shown in FIG. 1;

DETAILED DESCRIPTION

Figure 1:
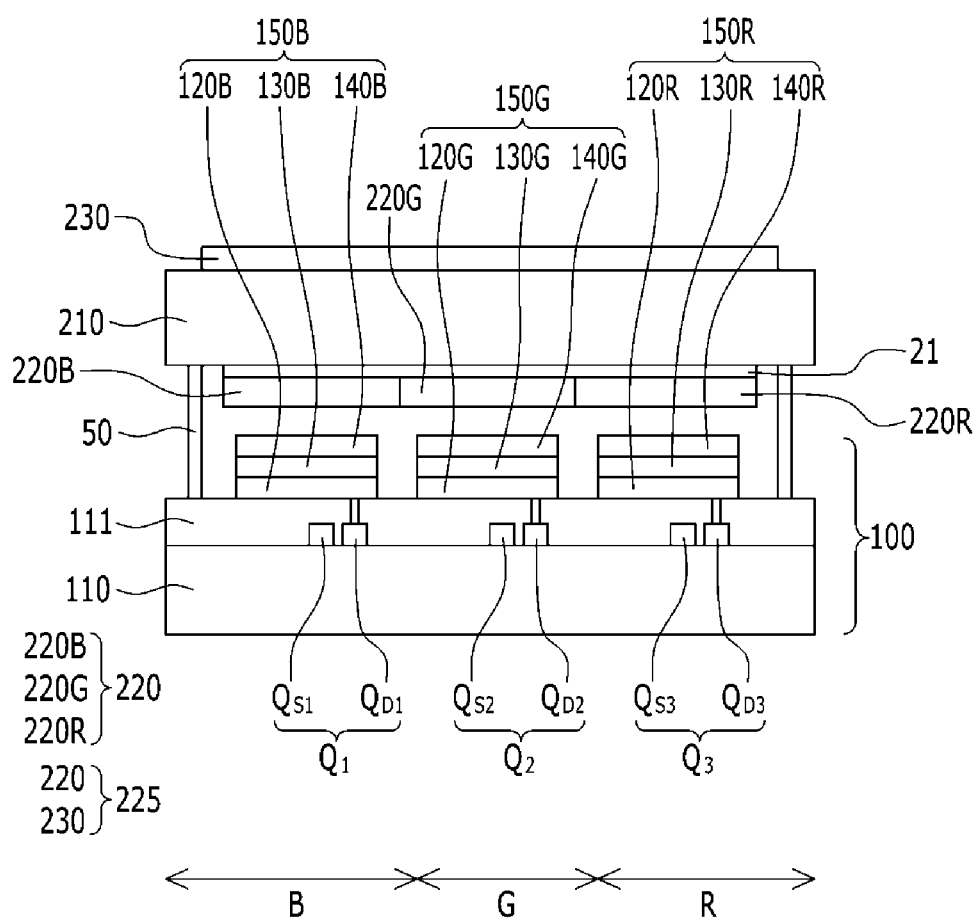
FIG. 1 is a schematic cross-sectional view of an embodiment of an organic light emitting device according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example In an exemplary embodiment, if when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of an organic light emitting device according to the invention will be described referring to the accompanying drawings.

Figure 2:
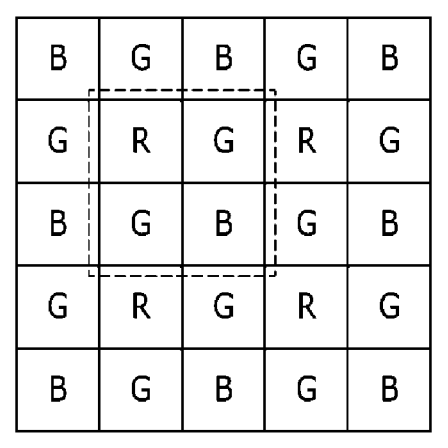

FIG. 1 is a schematic cross-sectional view of an embodiment of an organic light emitting device according to the invention, and FIG. 2 is a top plan view showing an embodiment of the arrangement of a plurality of pixels of the display panel in an embodiment of the organic light emitting device shown in FIG. 1.

In FIG. 1, for convenience of description, a constituent element including "R" in the reference numeral refers to a constituent element included in a first pixel, e.g., a red pixel, a constituent element including "G" in the reference numeral refers to a constituent element included in a second pixel, e.g., a green pixel, and a constituent element including "B" in the reference numeral refers to a constituent element included in a third pixel, e.g., a blue pixel.

Referring to FIG. 1, an embodiment of an organic light emitting device according to the invention includes a display panel 100 and a circular polarizing plate 225 disposed opposite to, e.g., facing, the display panel 100.

First, the display panel 100 will hereinafter be described.

Referring to FIG. 2, the display panel 100 includes a first pixel, e.g., a blue pixel (B) that displays a blue color, a second pixel, e.g., a green pixel (G) that displays a green color, and a third pixel, e.g., a red pixel (R) that displays a red color.

The blue pixel (B), green pixel (G) and red pixel (R) are primary pixels for displaying full colors, and may be alternately arranged, as a pixel group or a unit pixel, along a row and/or column. FIG. 2 shows an embodiment having a structure in which one red pixel (R), two green pixels (G) and one blue pixel (B) define a pixel group or a unit pixel, but not being limited thereto. In an alternative embodiment, a white pixel may be further included in the pixel group or the unit pixel, and thus, one red pixel (R), one green pixel (G), one blue pixel (B) and one white pixel W may define a pixel group or a unit pixel. In such an embodiment, the structure and the arrangement of pixels or unit pixels may be variously modified.

Referring to FIG. 1, in an embodiment, the display panel 100 includes a base substrate 110, thin film transistor arrays $Q_1$, $Q_2$ and $Q_3$ disposed on the base substrate 110, and organic light emitting diodes 150B, 150G and 150R.

In an embodiment, the base substrate 110 may include a glass substrate, a polymer substrate, or a semiconductor substrate. In such an embodiment, the polymer substrate may be, for example, polycarbonate ("PC"), polymethylmethacrylate, polyethylene terephthalate ("PET"), polyethylene naphthalate, polyamide, polyethersulfone, a copolymer thereof, a derivative thereof, or a combination thereof, and the polymer substrate may be effectively used to implement a flexible device.

The thin film transistor arrays $Q_1$, $Q_2$, and $Q_3$ includes switching thin film transistors $Q_{S1}$, $Q_{S2}$ and $Q_{S3}$, and driving thin film transistors $Q_{D1}$, $Q_{D2}$ and $Q_{D3}$ disposed in a pixel corresponding thereto. In an embodiment, the switching thin film transistors $Q_{S1}$, $Q_{S2}$ and $Q_{S3}$ and the driving thin film transistors $Q_{D1}$, $Q_{D2}$ and $Q_{D3}$ are electrically connected one another. In one embodiment, for example, a first thin film transistor array $Q_1$ including a first switching thin film transistor $Q_{S1}$ and a first driving thin film transistor $Q_{D1}$, which are connected to each other, is disposed in the blue pixel (B), a second thin film transistor array $Q_2$ including a second switching thin film transistor $Q_{S2}$ and a second driving thin film transistor $Q_{D2}$, which are connected to each other, is disposed in the green pixel (G), and a third thin film transistor array $Q_3$ including a third switching thin film transistor $Q_{S3}$ and a third driving thin film transistor $Q_{D3}$, which are connected to each other, is disposed in the red pixel (R).

In an embodiment, each of the switching thin film transistors $Q_{S1}$, $Q_{S2}$ and $Q_{S3}$ has a control terminal, an input terminal and an output terminal. In such an embodiment, the control terminal of each of the switching thin film transistors $Q_{S1}$, $Q_{S2}$ and $Q_{S3}$ is connected to a gate line, the input terminal of each of the switching thin film transistors $Q_{S1}$, $Q_{S2}$ and $Q_{S3}$ is connected to a data line, and the output terminal of each of the switching thin film transistors $Q_{S1}$, $Q_{S2}$ and $Q_{S3}$ is connected to a corresponding driving thin film transistor among the driving thin film transistors $Q_{D1}$, $Q_{D2}$ and $Q_{D3}$. The switching thin film transistors $Q_{S1}$, $Q_{S2}$ and $Q_{S3}$ respond to a scan signal applied thereto through the gate line and transport a data signal applied thereto though the data line to the driving thin film transistors $Q_{D1}$, $Q_{D2}$ and $Q_{D3}$.

In such an embodiment, each of the driving thin film transistors $Q_{D1}$, $Q_{D2}$ and $Q_{D3}$ has a control terminal, an input terminal and an output terminal. In such an embodiment, the control terminal of each of the driving thin film transistors $Q_{D1}$, $Q_{D2}$ and $Q_{D3}$ is connected to a corresponding switching thin film transistor among the switching thin film transistors $Q_{S1}$, $Q_{S2}$ and $Q_{S3}$, the input terminal of each of the driving thin film transistors $Q_{D1}$, $Q_{D2}$ and $Q_{D3}$ is connected to a driving voltage line, and the output terminal of each of the driving thin film transistors $Q_{D1}$, $Q_{D2}$ and $Q_{D3}$ is connected to a corresponding organic light emitting diode among the organic light emitting diodes 150B, 150G and 150R. The driving thin film transistors $Q_{D1}$, $Q_{D2}$ and $Q_{D3}$ discharge an output current having a different magnitude depending on a voltage applied between the control terminal and the output terminal thereof.

An insulation layer 111 is disposed on the thin film transistor arrays $Q_1$, $Q_2$ and $Q_3$. In such an embodiment, a plurality of contact holes that partially expose the switching thin film transistors $Q_{S1}$, $Q_{S2}$ and $Q_{S3}$ and/or the driving thin film transistors $Q_{D1}$, $Q_{D2}$ and $Q_{D3}$ is defined through the insulation layer 111.

The organic light emitting diodes 150B, 150G and 150R are disposed on the insulation layer 111. The organic light emitting diodes 150B, 150G and 150R include lower electrodes 120B, 120G and 120R, emission layers 130B, 130G and 130R, and upper electrodes 140B, 140G and 140R.

Each of the lower electrodes 120B, 120G and 120R is connected to the output terminal of the corresponding driving thin film transistor among the driving thin film transistors $Q_{D1}$, $Q_{D2}$ and $Q_{D3}$, and the upper electrodes 140B, 140G and 140R are connected to a common voltage.

One of the lower electrodes 120B, 120G and 120R and the upper electrodes 140B, 140G and 140R may be an anode, and the other of the lower electrodes 120B, 120G and 120R and the upper electrodes 140B, 140G and 140R may be a cathode. In one embodiment, for example, the lower electrodes 120B, 120G and 120R may be an anode, and the upper electrodes 140B, 140G and 140R may be a cathode. The anode is an electrode into which holes are injected and may include or be made of a conductive material having a high work function, and the cathode is an electrode into which electrons are injected and may include or be made of a conductive material having a low work function.

At least one of the lower electrodes 120B, 120G and 120R and the upper electrodes 140B, 140G and 140R may include or be made of a transparent or semi-transparent conductive material which allows light emitted thereto to exit outside. In such an embodiment, the transparent or semi-transparent conductive material may include, for example, a conductive oxide thin film such as indium tin oxide ("ITO") or indium zinc oxide ("IZO") and/or a metal thin film such as an Ag thin film.

The emission layers 130B, 130G and 130R may include organic materials, and may intrinsically emit light of a color, e.g., red, green or blue color light or the like, when a voltage is applied to the lower electrodes 120B, 120G and 120R, and the upper electrodes 140B, 140G and 140R.

An auxiliary layer (not shown) may be further disposed or provided between the lower electrodes 120B, 120G and 120R and the emission layers 130B, 130G and 130R, and/or between the upper electrodes 140B, 140G and 140R and the emission layers 130B, 130G and 130R. The auxiliary layer may include a hole transporting layer, a hole injecting layer, an electron injecting layer, and an electron transporting layer to balance electrons and holes, but is not limited thereto.

In an embodiment, a microcavity effect occurs in the pixels. In such an embodiment, the lower electrodes 120B, 120G and 120R, the emission layers 130B, 130G and 130R, and the upper electrodes 140B, 140G and 140R exhibit the microcavity effect. The microcavity effect occurs when light at a particular wavelength is amplified by reinforcement/interference, as light from the emission layers 130B, 130G and 130R is repeatedly reflected between a reflection layer and a (semi)transparent layer spaced apart by a length of an optical path, and thus light corresponding to a resonance wavelength of the microcavity may be reinforced, while light at the other wavelengths may be suppressed.

In such an embodiment, to obtain the microcavity effect, one of the lower electrodes 120B, 120G and 120R and the upper electrodes 140B, 140G and 140R may include a reflection layer, while the other of the lower electrodes 120B, 120G and 120R and the upper electrodes 140B, 140G and 140R may include a (semi)transparent layer. The light reinforced due to the microcavity effect may have a wavelength range determined depending on the length of an optical path, and the length of the optical path may be, for example, determined as a distance between the lower electrodes 120B, 120G and 120R and the upper electrodes 140B, 140G and 140R. In such an embodiment, the red pixel (R) may have an optical path length through which light in a red wavelength region is selectively amplified, the green pixel (G) may have an optical path length through which light in a green wavelength region is selectively amplified, and the blue pixel (B) may have an optical path length through which light in a blue wavelength region is selectively amplified. In such an embodiment, the microcavity effect may selectively reinforce light in a particular wavelength region in each pixel and thus increase color purity.

An opposing substrate 210 is disposed opposed to the display panel 100. The opposing substrate 210 may include, for example, an encapsulation substrate. The encapsulation substrate may include or be made of glass, metal or a polymer, where the polymer may be, for example, PET, polyvinyl alcohol ("PVA"), PC, triacetyl cellulose ("TAC"), a copolymer thereof, a derivative thereof, and/or a combination thereof. The encapsulation substrate may seal the organic light emitting diodes 150B, 150G and 150R, and effectively prevent the inflow of moisture and/or oxygen from the outside.

A circular polarizing plate 225 may have a plurality of retardations (e.g., a plurality of retardation values) corresponding to pixels of the display panel 100. In one embodiment, for example, the circular polarizing plate 225 may respectively have a first retardation corresponding to the red pixel (R), a second retardation responding to the green pixel (G), and a third retardation corresponding to a blue pixel (B). In such an embodiment, the first, second and third retardation values may be different from each other.

The circular polarizing plate 225 includes a polarizer 230 and a compensation film 220.

The polarizer 230 may be disposed on a surface of the opposing substrate 210. The polarizer 230 may be disposed on the surface where light enters, and may be a linear polarizer that changes unpolarized incident light into a linearly polarized light.

The polarizer 230 may include, for example, elongated PVA, and may be formed according to a method of, for example, drawing a PVA film, adsorbing iodine or a dichroic dye thereto, and treating it with boric acid and washing the same.

The polarizer 230 may include, for example, a polarizing film prepared by melt-blending a polymer and a dichroic dye, and the polarizing film may be, for example, made by mixing a polymer and a dichroic dye and melting the mixture of the polymer and the dichroic dye at a temperature above the melting point of the polymer to manufacture the mixture in a form of a sheet.

The compensation film 220 may be disposed on another surface of the opposing substrate 210 to face the polarizer 230. In such an embodiment, the opposing substrate 210 is disposed between the compensation film 220 and the polarizer 230. However, the invention is not limited thereto, and may have a structure in which the compensation film 220 and the polarizer 230 are sequentially disposed, e.g., laminated, on a surface of the opposing substrate 210. In an alternative embodiment, the opposing substrate 210 may be omitted.

An alignment layer 21 may be disposed between the compensation film 220 and the opposing substrate 210. The alignment layer 21 may control arrangement of liquid crystals in the post-described compensation film 220, and may be, for example, made of polyamic acid, polyimide, or a combination thereof. The surface of the alignment layer 21 may have a plurality of grooves formed at its surface through a mechanical treatment such as rubbing or a photo-treatment such as photo-alignment. The alignment layer 21 may be omitted as necessary.

The compensation film 220 may include a cured liquid crystal. The liquid crystal may have a rod shape aligned in a predetermined direction, and may include, for example, a monomer, an oligomer or a polymer. The liquid crystal may have, for example, positive or negative birefringence (Δn). The birefringence (Δn) is a difference obtained by subtracting the refractive index ($n_o$) of light propagating perpendicular to an optical axis from the refractive index ($n_e$) of light propagating parallel to the optical axis.

In an embodiment, the liquid crystal may be a reactive mesogenic liquid crystal, and may include, for example, a mesogenic moiety and a polymerizable functional group. In one embodiment, for example, the reactive mesogenic liquid crystal may include at least one of a rod-shaped aromatic derivative having a reactive cross-linking group, propylene glycol 1-methyl, propylene glycol 2-acetate and a compound represented by $P^1$-$A^1$-$(Z^1$-$A^2)_n$-$P^2$ (where $P^1$ and $P^2$ independently include a polymerizationic functional group such as acrylate, methacrylate, acryloyl, vinyl, vinyloxy, epoxy or a combination thereof, $A^1$ and $A^2$ independently include 1,4-phenylene, a naphthalene-2,6-diyl group or a combination thereof, $Z^1$ includes a single bond, —COO—, —OCO— or a combination thereof, and n is 0, 1 or 2), but is not limited thereto.

The liquid crystal may be a thermosetting liquid crystal or a photocurable liquid crystal, and for example, the liquid crystal may be a photocurable liquid crystal. When the liquid crystal is a photocurable liquid crystal, the liquid crystal may be cured by ultraviolet ("UV") rays having a wavelength in a range from about 250 nanometers (nm) to about 400 nm.

The compensation film 220 may include one or more kinds of liquid crystal.

The compensation film 220 may be formed of a composition including the liquid crystal, and the composition may include various additives such as a reaction initiator, a surfactant, a dissolution assistant and/or a dispersing agent, and a solvent in addition to the liquid crystal. The composition may be applied through a solution process, for example, spin coating, slit coating and/or inkjet coating, and the thickness of the compensation film 220 may be adjusted in consideration of a refractive index and the like.

The compensation film 220 may circularly polarize light passed through the polarizer 230, and thus generate retardation. In one embodiment, for example, the compensation film 220 may be a λ/4 plate. The λ/4 plate may have an in-phase retardation ($R_e$) (hereinafter, referred to as 'retardation'), for example, in a range from about 110 nm to about 160 nm for incident light having a wavelength of about 550 nm.

In an embodiment, the compensation film 220 may have two or more regions having different retardations from each other.

Figure 3:
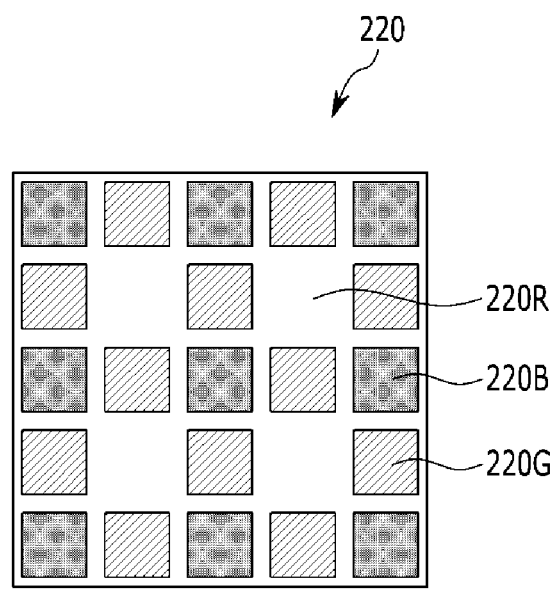
FIG. 3 is a top plan view of an embodiment of a compensation film including a plurality of regions having different retardations from each other in the organic light emitting device of FIG. 1.

FIG. 3 is a top plan view of an embodiment of a compensation film including a plurality of regions having different retardations from each other in the organic light emitting device of FIG. 1.

Referring to FIG. 3, the compensation film 220 may have a plurality of regions 220B, 220G and 220R having different retardations from each other, and the plurality of regions 220B, 220G and 220R may respectively correspond to a plurality of pixels of the display panel 100 shown in FIG. 2. In one embodiment, for example, the compensation film 220 may include a first region 220B corresponding to a blue pixel (B), a second region 220G corresponding to a green pixel (G), and a third region 220R corresponding to a red pixel (R). In such an embodiment shown in FIG. 3, the third region 220R may not be separately partitioned but may be defined as a region of the compensation film 200 corresponding to the red pixel (R).

At least two of the first region 220B, the second region 220G and the third region 220R of the compensation film 220 may have different retardations from each other, and the retardations of the first region 220B, the second region 220G and the third region 220R may be determined based on the wavelength of reflection light in each pixel of the display panel 100.

Herein, the reflection light indicates externally incident light (hereinafter, 'external light') reflected by a metal electrode, a metal wire, and the like of the display panel. As described above, the display panel 100 exhibits the microcavity effect, and thus a part of the reflection light may be trapped between the electrodes, while another part of the reflection light may be leaked to the outside. The reflection light may be blocked or reduced by the polarizer 230 and the compensation film 220.

Figure 4:
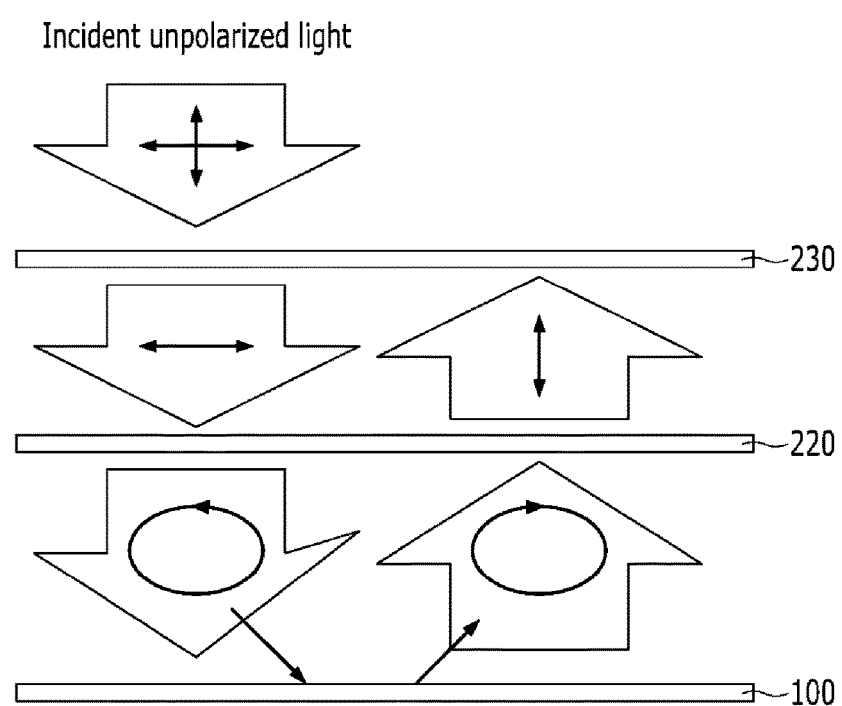
FIG. 4 is a schematic view showing the external light antireflection principle in an embodiment of an organic light emitting device according to the invention.

FIG. 4 is a schematic view showing the external light antireflection principle in an embodiment of an organic light emitting device according to the invention.

Referring to FIG. 4, when the incident unpolarized light, that is, external light having entered from the outside, is passed through the polarizer 230, only a first polarized perpendicular component, which is one polarized perpendicular component of two polarized perpendicular components, is transmitted, and the polarized light is changed into circularly polarized light by passing through the compensation film 220. When the circularly polarized light is reflected in a display panel 100 including a substrate, an electrode and so on, and the circular polarization direction is changed, and the circularly polarized light having changed circular polarization direction is sequentially passed through the compensation film 220, only a second polarized perpendicular component, which is the other polarized perpendicular component of the two polarized perpendicular components, may be transmitted. As the second polarized perpendicular component is not passed through the polarizer 230, and light does not exit to the outside, effects of preventing the external light reflection may be provided.

In an embodiment, as described above, the microcavity effect between the lower electrodes 120B 120G, and 120R, and the upper electrodes 140B, 140G and 140R of the display panel 100 may amplify light at a particular wavelength in each pixel. In such an embodiment, the microcavity effect may further amplify light in a red wavelength region of the light emitted from the emission layer 130R in a red pixel, light in a green wavelength region of the light emitted from the emission layer 130G in a green pixel, and light in a blue wavelength region of the light emitted from the emission layer 130B in a blue pixel.

Herein, as for the aforementioned reflection light, light in a particular wavelength region may be trapped, while light in the other wavelength regions may be reflected due to the microcavity effect between the lower electrodes 120B, 120G and 120R, and the upper electrodes 140B, 140G and 140R of the display panel 100. In one embodiment, for example, light in a red wavelength region of the reflection light may be internally trapped in a red pixel, while light in the other wavelength regions may be reflected due to the microcavity effect in a red pixel. In one embodiment, for example, light in a green wavelength region of the reflection light may be internally trapped in a green pixel, while light in the other wavelength regions may be reflected in a green pixel. In one embodiment, for example, light in a blue wavelength region of the reflection light may be internally trapped in a blue pixel, while light in the other wavelength regions may be reflected in a blue pixel.

Accordingly, the reflection light may be effectively suppressed and/or reduced by adjusting the retardation of the compensation film 220 to the wavelength range of the light that is not trapped but reflected in each pixel.

In an embodiment, as described above, the retardation of the compensation film 220 is related to a wavelength region of the reflected light other than that of the trapped light due to the microcavity effect in each pixel. Accordingly, in such embodiment, a pixel in which light in a short wavelength region is trapped due to the microcavity effect may be disposed to correspond to a region having a large retardation, while a pixel in which light in a long wavelength region is trapped due to the microcavity effect may be disposed to correspond to a region having a small retardation.

In one embodiment, for example, when retardations of the first region 220B, second region 220G and third region 220R of the compensation film 220 are defined as first, second and third retardations, respectively, retardations of the compensation film 220 may, for example, satisfy the following Relationship 1 or 2.

$$R_{e1} > R_{e2} \geq R_{e3} \qquad \text{[Relationship 1]}$$

$$R_{e1} \geq R_{e2} > R_{e3} \qquad \text{[Relationship 2]}$$

In Relationship 1 or 2, $R_{e1}$, $R_{e2}$, and $R_{e3}$ denote the first, second and third retardations, respectively.

In one embodiment, for example, while the retardations of the first region 220B, second region 220G and third region 220R of the compensation film 220 satisfy Relationship 1 or 2, the first retardation may be in a range of about 125 nm to about 155 nm, the second retardation may in a range of be about 110 nm to about 160 nm, and the third retardation may be in a range of about 110 nm to about 125 nm.

In an alternative embodiment, while the retardations of the first region 220B, second region 220G and third region 220R of the compensation film 220 satisfy Relationship 1 or 2, the first retardation may be in a range of about 135 nm to about 145 nm, the second retardation may be in a range of about 130 nm to about 140 nm, and the third retardation may be in a range of about 115 nm to about 125 nm.

In an embodiment, where the compensation film 220 has each retardation of the first, second and third regions within the corresponding range described above, a reflectance in each of the blue pixel (B), the green pixel (G) and the red pixel (R) may be less than or equal to about 5%.

In such an embodiment, where the compensation film 220 has each retardation of the first, second, and third regions within corresponding range described above, a reflection color shift ($\Delta a^* b^*$) in each of the blue pixel (B), the green pixel (G) and the red pixel (R) may be less than or equal to about 5.

In such an embodiment, since the color shift of the reflection light in each pixel may be adjusted through the above compensation film 220, even when each pixel has a reflection color shift of less than or equal to about 5, a flection color shift, e.g., the overall reflection color shift, of an organic light emitting device may be adjusted to have less than or equal to about 5 by effectively adjusting the reflection color shifts of the red, green and blue pixels.

In such an embodiment, as described above, the retardation of the compensation film 220 may be adjusted depending on the wavelength range of the reflection light in each pixel, and thus the compensation film 220 may effectively prevent a color shift due to a particular tone, for example, a bluish tone, by a reflection light of which light in a particular wavelength region is reinforced, as well as substantially reduce leakage of the reflection light. Accordingly, in such an embodiment, visibility may be less deteriorated, and thus display characteristics may be improved.

The display panel 100 and the opposing substrate 210 may be bonded by a sealant 50, and a filler may be filled in a space defined, e.g., partitioned, by the display panel 100, the opposing substrate 210 and the sealant 50.

Hereinafter, an alternative embodiment of an organic light emitting device according to the invention will be described in detail referring to FIGS. 5 and 6.

Figure 5:
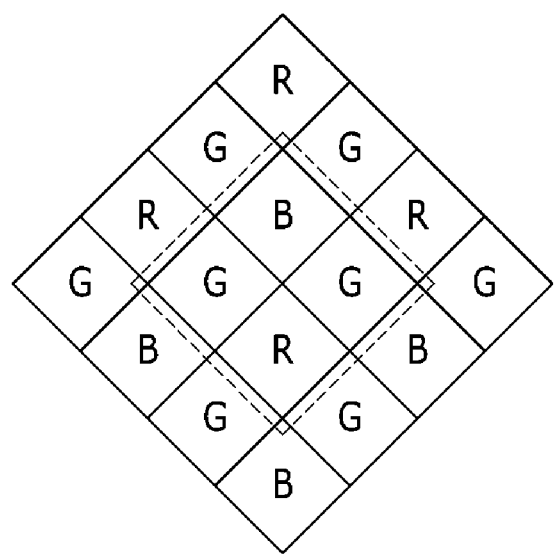
FIG. 5 is a top plan view showing the an arrangement of a plurality of pixels of the display panel in an alternative embodiment of the organic light emitting device shown in FIG. 1.

FIG. 5 is a top plan view showing arrangement of a plurality of pixels of the display panel in an alternative embodiment of the organic light emitting device shown in FIG. 1.

Referring to FIG. 5, in an embodiment, the display panel 100 includes a red pixel (R) that displays a red color, a green pixel (G) that displays a green color, and a blue a pixel (B) that displays a blue color.

In such an embodiment, as shown in FIG. 5, green pixels (G) are disposed in a first row with a predetermined interval, a red pixel (R) and a blue pixel (B) are alternatively disposed in a second row, green pixels (G) are disposed in a third row with a predetermined interval, a blue pixel (B) and a red pixel (R) are alternatively disposed in a fourth row, and such an arrangement are repeated up to an N-th row. Such a pixel structure is referred to as a PenTile matrix structure, in which high resolution may be realized with a relatively small number of pixels by sharing neighboring pixels and displaying a color through a rendering operation. In such an embodiment, the composition and disposition of the pixels may be variously modified.

Figure 6:
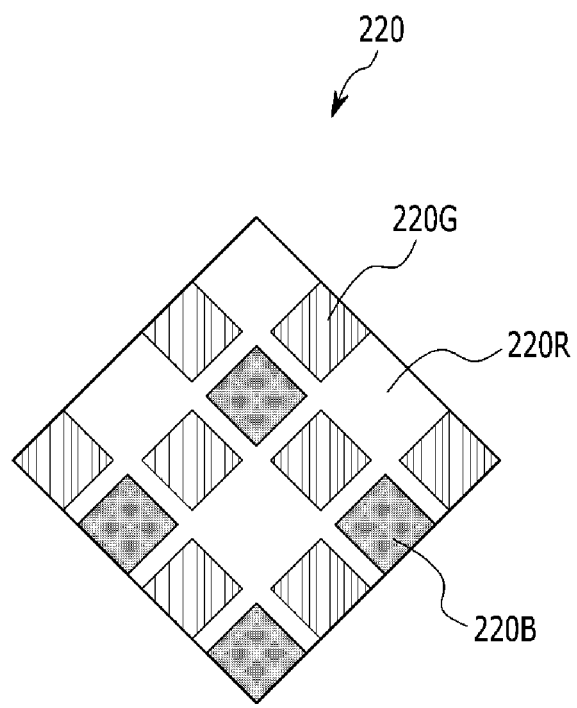
FIG. 6 is a top plan view of an embodiment of a compensation film including a plurality of regions having different retardations from each other in the organic light emitting device having the pixel arrangement of FIG. 5.

FIG. 6 is a top plan view of an embodiment of a compensation film having a plurality of regions having different retardations from each other in the organic light emitting device having pixel arrangement of FIG. 5.

Referring to FIG. 6, an embodiment of the compensation film 220 includes a plurality of regions 220B, 220G and 220R having different retardations from each other, and the plurality of regions 220B, 220G and 220R respectively correspond to the pixels of the display panel 100 shown in FIG. 5. In one embodiment, for example, the compensation film 220 includes the first region 220B corresponding to the blue pixel (B), the second region 220G corresponding to the green pixel (G), and the third region 220R corresponding to the red pixel (R). In such an embodiment shown in FIG. 6, the third region 220R may not be separately partitioned but may be defined as a region of the compensation film 200 corresponding to the red pixel (R).

At least two of the first region 220B, the second region 220G and the third region 220R of the compensation film 220 may have different retardations from each other, and the retardations of the first region 220B, the second region 220G and the third region 220R may be determined by the wavelength of reflection light in each pixel of the display panel 100. The first region 220B, the second region 220G and the third region 220R of the compensation film 220 shown in FIG. 5 is substantially the same as those in the embodiments described above.

In one embodiment, for example, when the first region 220B, the second region 220G and the third region 220R of the compensation film 220 respectively have first, second and third retardations, respectively, the compensation film 220 may have retardations satisfying the following Relationship 1 or 2.

$$R_{e1} > R_{e2} \geq R_{e3} \quad [\text{Relationship 1}]$$

$$R_{e1} \geq R_{e2} > R_{e3} \quad [\text{Relationship 2}]$$

In Relationship 1 or 2, $R_{e1}$, $R_{e2}$, and $R_{e3}$ denote the first, second and third retardations, respectively.

In one embodiment, for example, while the first, second and third retardations satisfy Relationship 1 or 2, the first retardation may be in a range of about 125 nm to about 155 nm, the second retardation may be in a range of about 110 nm to about 160 nm, and the third retardation may be in a range of about 110 nm to about 125 nm.

In one embodiment, for example, while the first, second and third retardations satisfy Relationship 1 or 2, the first retardation may be in a range of about 135 nm to about 145 nm, the second retardation may be in a range of about 130 nm to about 140 nm, and the third retardation may be in a range of about 115 nm to about 125 nm.

In an embodiment, when the compensation film 220 has the first, second and third retardations respectively within the ranges above, a reflectance in each of the blue pixel (B), the green pixel (G) and the red pixel (R) may be less than or equal to about 5%.

In an embodiment, when the compensation film 220 has the first, second and third retardations respectively within the ranges above, a reflection color shift ($\Delta a^*b^*$) in each of the blue pixel (B), the green pixel (G) and the red pixel (R) may be less than or equal to about 5. In such an embodiment, a reflection color shift ($\Delta a^*b^*$) of the organic light emitting device may be less than or equal to about 5. Herein, $\Delta a^*b^*$ denotes a chromaticity index difference defined by CIE 1976 color space (CIElab).

Hereinafter, an embodiment of a method of manufacturing the organic light emitting device shown in FIG. 1 will be described referring to FIGS. 7 to 11 along with FIG. 1.

FIGS. 7 to 11 are cross-sectional views showing an embodiment of a method of manufacturing an organic light emitting device, according to the invention.

First, the display panel 100 is prepared.

Figure 7:
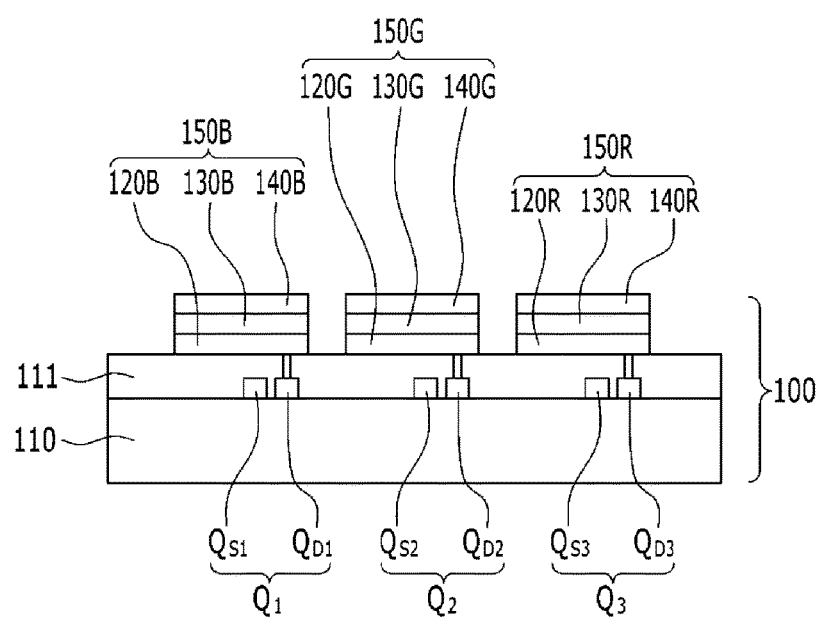
FIGS. 7 to 11 are cross-sectional views showing an embodiment of a method of manufacturing an organic light emitting device, according to the invention.

Referring to FIG. 7, a gate line including a gate electrode, a source electrode including a gate insulating layer, a semiconductor layer and a data line, and a drain electrode may be provided, e.g., laminated, on the base substrate 110, thereby forming the thin film transistor arrays $Q_1$, $Q_2$ and $Q_3$.

An insulation layer 111 may be provided, e.g., formed, on the thin film transistor arrays $Q_1$, $Q_2$, and $Q_3$, and a contact hole partially exposing the thin film transistor arrays $Q_1$, $Q_2$, and $Q_3$ is formed in the insulation layer 111.

A conductive layer may be provided, e.g., laminated, on the insulation layer 111 and patterned, thereby forming the lower electrodes 120B, 120G and 120R. The emission layers 130B, 130G and 130R may be provided, e.g., formed, on the lower electrodes 120B, 120G and 120R. A conductive layer may be provided, e.g., laminated, on the emission layers 130B, 130G and 130R, thereby forming the upper electrodes 140B, 140G and 140R that cover the emission layers 130B, 130G and 130R.

Subsequently, the compensation film 220 may be prepared.

Figure 8:
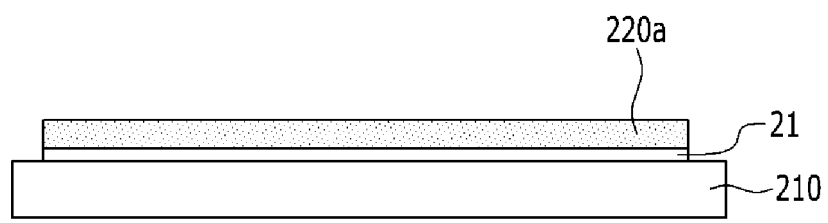

Referring to FIG. 8, an alignment layer 21 may be provided, e.g., formed, on the opposing substrate 210. The alignment layer 21 may be, for example, formed by coating polyamic acid in a solution process and curing the coated polyamic acid, and a plurality of grooves may be formed thereon through a mechanical treatment such as rubbing or a photo-treatment such as photo-alignment. Accordingly, liquid crystals, which will be described later in detail, may be effectively aligned on the surface of the alignment layer 21.

Subsequently, a liquid crystal layer 220a for a compensation film may be formed by coating a liquid crystal composition on the alignment layer 21. The liquid crystal composition may include a liquid crystal, various additives such as a reaction initiator, a surfactant, a dissolution assistant and/or a dispersing agent, and a solvent, and may be, for example, coated in a solution process such as Inkjet printing, bar coating, slit coating, spin coating, and the like.

Subsequently, the liquid crystal layer 220a for a compensation film may be cured. The curing of the liquid crystal layer 220a for a compensation film may be performed more than once after dividing the liquid crystal layer into a plurality of regions, and each curing may be performed at a different temperature. Accordingly, the compensation film 220 may include the regions having different retardations from one another.

Figure 9:
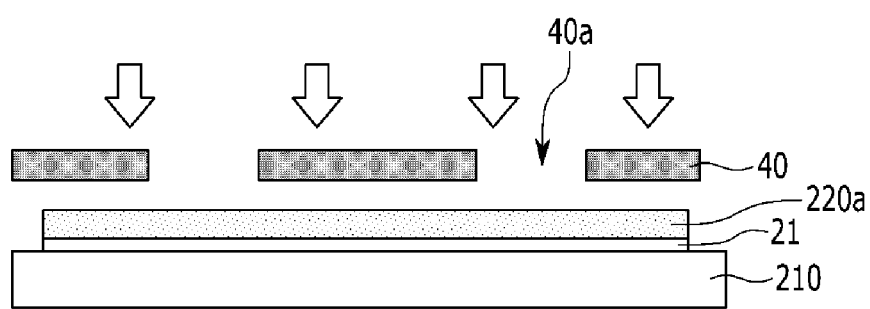

Referring to FIG. 9, a mask 40 having a plurality of openings 40a is disposed on the liquid crystal layer 220a for a compensation film. Herein, the openings 40a may be respectively disposed to correspond to the blue pixel (B) of the display panel 100. However, the invention is not limited thereto, and the openings 40a may be disposed to correspond to the red pixel (R) or the green pixel (G). Subsequently, a first region 220B having a first retardation is formed by primarily exposing the regions corresponding to the openings (e.g., a first exposure) to light, and curing the exposed region of the liquid crystal layer 220a for a compensation film through the openings 40a of the mask 40 at a first temperature. The first temperature may be, for example, a room temperature (e.g., about 25° C.), but may be variously determined based on retardation of the first region 220B.

Figure 10:
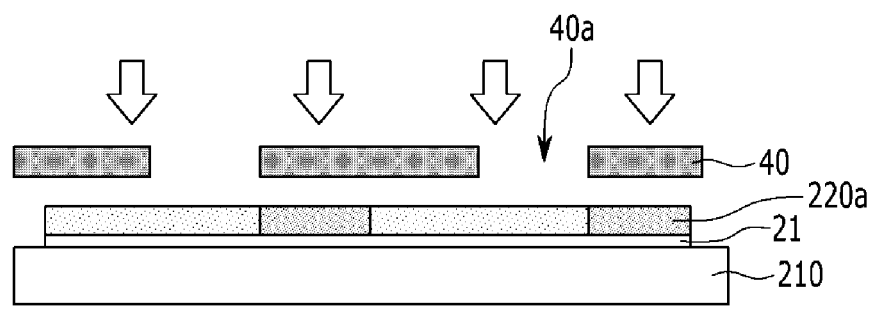

Next, referring to FIG. 10, a mask, e.g., the mask 40 having a plurality of openings 40a, is disposed, e.g., moved, on the liquid crystal layer 220a for the compensation film. The liquid crystal layer 220a for a compensation film may be treated at a second temperature higher than the first temperature, and for example, the opposing substrate 210 having the liquid crystal layer 220a for a compensation film is put in a heater such as a hot plate and an oven to increase the temperature. The openings 40a of the mask 40 may be disposed to correspond to the green pixel (G) of the display panel 100, but the invention is not limited thereto, and the openings 40a may be disposed to correspond to the red pixel (R) or the blue pixel (B). Subsequently, a second region 220G having a second retardation is formed by secondarily exposing the regions corresponding to the openings to light (e.g., a second exposure), and curing the exposed region of the liquid crystal layer 220a for a compensation film through the openings 40a of the mask 40 at the second temperature.

The second temperature may be, for example, in a range of about 30° C. to about 60° C., but is variously determined based on retardation of the second region 220G.

Figure 11:
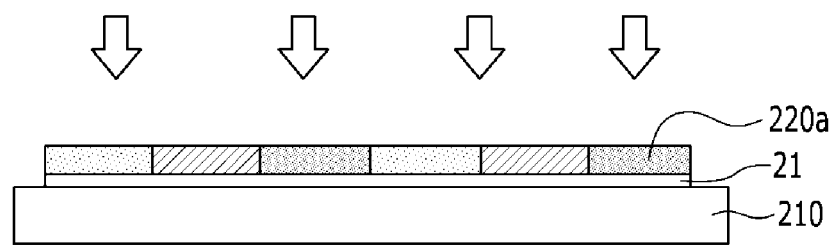

Next, referring to FIG. 11, the liquid crystal layer 220a for the compensation film is thirdly exposed by further increasing the temperature (e.g., a third exposure). Accordingly, the region except for the first region 220B and the second region 220G is cured and forms a third region 220R having a third retardation. The third temperature may be, for example, in a range of about 63° C. to about 90° C., but may be variously determined based on retardation of the third region 220R.

Accordingly, the liquid crystal layer 220a is cured, obtaining the compensation film 220 including the first region 220B, the second region 220G and the third region 220R. The first region 220B, the second region 220G and the third region 220R are respectively cured at different temperatures as described above, and may have different retardations from one another.

When the retardations of the first region 220B, the second region 220G and the third region 220R of the compensation film 220 have first, second, and third retardations, respectively, the compensation film 220 may, for example, have retardation satisfying the following Relationship 1 or 2.

$$R_{e1} > R_{e2} \geq R_{e3}$$ [Relationship 1]

$$R_{e1} \geq R_{e2} > R_{e3}$$ [Relationship 2]

In Relationship 1 or 2, $R_{e1}$, $R_{e2}$, and $R_{e3}$ denote the first, second and third retardations, respectively.

In one embodiment, for example, while the first, second and third retardations satisfy Relationship 1 or 2, the first retardation may be in a range of about 125 nm to about 155 nm, the second retardation may be in a range of about 110 nm to about 160 nm, and the third retardation may be in a range of about 110 nm to about 125 nm.

In one embodiment, for example, while the first, second and third retardations satisfy Relationship 1 or 2, the first retardation may be in a range of about 135 nm to about 145 nm, the second retardation may be in a range of about 130 nm to about 140 nm, and the third retardation may be in a range of about 115 nm to about 125 nm.

Herein, an embodiment of a method, where changing retardation is provided by changing a temperature (e.g., the exposure temperature) of the compensation film 220 is described in detail, but the invention is not limited thereto. In such an embodiment, any known method may be used to form a plurality of regions having different retardations from each other without any particular limit.

In the embodiment described above, the first, second and third regions are, for example, exposed in order of corresponding to the blue pixel (B), the green pixel (G) and the red pixel (R), but the invention is not limited thereto. In an alternative embodiment, the exposure order may be variously modified.

Subsequently, a polarizer 230 may be provided on, e.g., attached to, a surface (e.g., a second surface) of the opposing substrate 210, which is opposite to the surface (e.g., a first surface) on which the compensation film 200 is provided. However, the invention is not limited thereto, and the compensation film 220 and the polarizer 230 may be sequentially provided, e.g., laminated, on a same side or surface of the opposing substrate 210. The polarizer 230 may be made of elongated PVA, or may be a polarizing film formed by melt-blending a polymer and a dichroic dye.

Subsequently, the display panel 100, the compensation film 220 and the polarizer 230 may be assembled together.

The assembling may be performed by disposing the display panel 100 to face the opposing substrate 210, or by transferring the compensation film 220 and the polarizer 230 to the display panel 100 and removing the opposing substrate 210.

Referring back to FIG. 1, the assembling may be performed so that the first region 220B, the second region 220G and the third region 220B of the compensation film 220 may respectively correspond to the blue pixel (B), the green pixel (G) and the red pixel (R) of the display panel 100.

The display panel 100 may be bonded with the opposing substrate 210 by the sealant 50, and a filler may be filled in a space defined or partitioned by the display panel 100, the opposing substrate 210 and the sealant 50.

Hereinafter, embodiments of the invention will be described in greater detail with reference to examples. However, these examples are exemplary, and the invention is not limited thereto.

Preparation of Compensation Film

Example 1

Polyamic acid (Sunever SE 7492, Nissan Chemical) is coated on a glass substrate and baked at 200° C. for 1 hour, forming an alignment layer. Subsequently, a liquid crystal composition (RMS03-013C) is spin-coated on the alignment layer at 1500 revolutions per minute (rpm) for 15 seconds and preheated at 80° C., forming a liquid crystal layer. A mask is disposed on the liquid crystal layer and primarily exposed with a UV radiation amount of 500 millijoule (mJ) at 25° C., forming a first region. Subsequently, the mask is moved, and then the substrate is secondarily exposed with a UV radiation amount of 500 mJ at 50° C. and cured, forming a second region. The mask is removed, and then the substrate is thirdly exposed with a UV radiation of 500 mJ at 70° C., forming a cured third region, and thus forming a compensation film.

Comparative Example 1

Polyamic acid (Sunever SE 7492, Nissan Chemical) is coated on the glass substrate and baked at 200° C. for 1 hour, forming an alignment layer. Subsequently, a liquid crystal composition (RMS03-013C) is spin-coated on the alignment layer at 1500 rpm for 15 seconds and preheated at 80° C., forming a liquid crystal layer. The liquid crystal layer is cured at 50° C. with a UV radiation amount of 500 mJ, preparing a compensation film.

Evaluation

Evaluation 1

Retardations of the first, second and third regions of the compensation film according to Example 1 are evaluated.

The retardations are evaluated in a rotation analyzer method.

Figure 12:
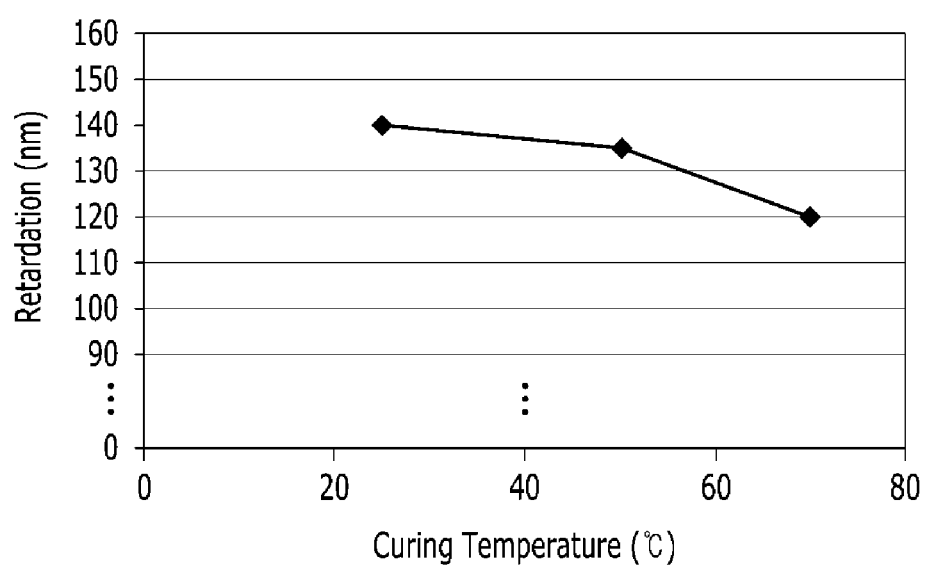
FIG. 12 is a graph showing retardation changes depending on a curing temperature in the compensation film according to Example 1.

The results are provided in FIG. 12 and Table 1.

FIG. 12 is a graph showing retardation changes depending on a curing temperature in the compensation film according to Example 1.

TABLE 1

| | Retardation (nm) | | |
|---|---|---|---|
| | First region 25° C. | Second region 50° C. | Third region 70° C. |
| Example 1 | 140 nm | 135 nm | 120 nm |
| Comparative Example 1 | | 135 nm | |

Referring to Table 1 and FIG. 12, the first region cured at about 25° C., the second region cured at about 50° C., and the third region cured at about 70° C. turn out to have different retardations from one another.

Evaluation 2

Reflectance and reflection color shift of organic light emitting devices manufactured by respectively applying the compensation films according to Example 1 and Comparative Example 1 are evaluated through a simulation.

Herein, a top emission type of organic light emitting display panel including a red pixel, a green pixel and a blue pixel having a microcavity structure for a microcavity effect is adopted, and the red, green and blue pixels are set to have different reflection characteristics of emission layers, while the emission layers are each set to have a thickness optimizing light emission of each pixel. In addition, liquid crystals having flat wavelength dispersion characteristics are used for the compensation films, and each pixel is set to have a retardation provided in Table 1.

The reflectance and reflection color shift in the blue, green and red pixels are evaluated under the conditions through a simulation, and the results are provided in Table 2.

TABLE 2

|  | Reflectance (%) | Reflection color shift ($\Delta a^*b^*$) |
| --- | --- | --- |
| Example 1 | 4.7 | 2.8 |
| Comparative Example 1 | 4.5 | 5.1 |

Referring to Table 2, the organic light emitting device including the compensation film according to Example 1 shows reflectance of less than or equal to 5% and satisfies a reflection color shift of less than or equal to 5, while the organic light emitting device including the compensation film according to Comparative Example 1 shows equivalent reflectance to that of the organic light emitting device including the compensation film according to Example 1 but a remarkably increased reflection color shift compared with the organic light emitting device including the compensation film according to Example 1.

While the disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting device, comprising
a display panel comprising a plurality of pixels, the display panel including a pair of electrodes and an emission layer between the pair of electrodes, the plurality of pixels including a blue pixel, a green pixel, and a red pixel, which display blue, green and red, respectively, and
a circular polarizing plate disposed opposite to the display panel and comprising a compensation film and a polarizer, the circular polarizing plate being positioned closer than the display panel from a side of a viewer, wherein
the compensation film is a single-layered $\lambda/4$ plate,
the compensation film includes a first region corresponding to the blue pixel and having a first retardation, a second region corresponding to the green pixel and having a second retardation, and a third region corresponding to the red pixel and having a third retardation,
the retardations of the compensation film satisfy the following relationship: Re1>Re2≥Re3; or Re1≥Re2>Re3,
wherein Re1, Re2 and Re3 denote the first, second and third retardations, respectively,
the first retardation is in a range of about 125 nm to about 155 nm,
the second retardation is in a range of about 110 nm to about 160 nm, and
the third retardation is in a range of about 110 nm to about 125 nm.

2. The organic light emitting device of claim 1, wherein a microcavity effect occurs in the pixels of the display panel.

3. The organic light emitting device of claim 1, wherein
the first retardation is in a range of about 135 nm to about 145 nm,
the second retardation is in a range of about 130 nm to about 140 nm, and
the third retardation is in a range of about 115 nm to about 125 nm.

4. The organic light emitting device of claim 1, wherein the compensation film comprises a cured liquid crystal.

5. The organic light emitting device of claim 1, wherein a reflectance in each of the blue pixel, the green pixel and the red pixel is less than or equal to about 5%.

6. The organic light emitting device of claim 1, wherein a reflection color shift ($\Delta a^*b^*$) in each of the blue pixel, the green pixel and the red pixel is less than or equal to about 5.

7. The organic light emitting device of claim 1, wherein a reflection color shift ($\Delta a^*b^*$) of the organic light emitting device is less than or equal to about 5.

8. The organic light emitting device of claim 1, further comprising:
an encapsulation substrate disposed opposite to the display panel,
the compensation film is attached to a first surface of the encapsulation substrate, and
the polarizer is attached to a second surface of the encapsulation substrate, which is opposite to the first surface.

9. A method of manufacturing an organic light emitting device, comprising:
preparing a display panel including a blue pixel, a green pixel and a red pixel which display blue, green and red, respectively, the display panel including a pair of electrodes and an emission layer between the pair of electrodes;
preparing a circular polarizing plate including a compensation film and a polarizer, the compensation film including a first region having a first retardation, a second region having a second retardation, and a third region having a third retardation; and
assembling the display panel and the circular polarizing plate,
wherein the display panel and the circular polarizing plate are assembled so that the first, second and third retardations of the compensation film respectively correspond to the blue pixel, the green pixel, and the red pixel of the display panel,
the retardations of the compensation film satisfy the following Relationship: Re1>Re2≥Re3; or Re1≥Re2>Re3, wherein Re1, Re2 and Re3 denote the first, second and third retardations, respectively, the first retardation is in a range of about 125 nm to about 155 nm, the second retardation is in a range of about 110 nm to about 160 nm, the third retardation is in a range of about 110 nm to about 125 nm, the circular polarizing plate being positioned closer than the display panel from the side of a viewer, and the compensation film is a single-layered λ/4 plate.

10. The method of claim 9, wherein the preparing the compensation film comprises:

providing a liquid crystal layer for the compensation film on a first surface of a substrate, and curing the liquid crystal layer for the compensation film while changing a temperature to provide the first, second and third regions having different retardations from each other.

11. The method of claim 10, wherein the curing the liquid crystal layer for the compensation film comprises:

disposing a mask on the liquid crystal layer and performing a first exposure at a first temperature to provide the first region;

disposing a mask on the liquid crystal layer and performing a second exposure at a second temperature to provide the second region; and performing a third exposure at a third temperature to provide the third region.

12. The method of claim 11, wherein the second temperature is higher than the first temperature, and the third temperature is higher than the second temperature.

13. The method of claim 10, further comprising:

providing an alignment layer on the substrate before the providing the liquid crystal layer for the compensation film.

14. The method of claim 10, further comprising:

providing the polarizer on a second surface of the substrate, which is opposite to the first surface, wherein the substrate is an encapsulation substrate.

15. The method of claim 9, wherein the first retardation is in a range of about 135 nm to about 145 nm, the second retardation is in a range of about 130 nm to about 140 nm, and the third retardation is in a range of about 115 nm to about 125 nm.

* * * * *